US012712536B2

(12) United States Patent
Wang

(10) Patent No.: US 12,712,536 B2
(45) Date of Patent: Aug. 18, 2026

(54) WIDE BAND-GAP PHOTO RELAY

(71) Applicant: Taiwan-Asia Semiconductor Corporation, Hsinchu City (TW)

(72) Inventor: Di-Bao Wang, Hsinchu City (TW)

(73) Assignee: Taiwan-Asia Semiconductor Corporation, Hsinchu City (TW)

( * ) Notice: Subject to any disclaimer, the term of this patent is extended or adjusted under 35 U.S.C. 154(b) by 91 days.

(21) Appl. No.: 18/769,990

(22) Filed: Jul. 11, 2024

(65) Prior Publication Data

US 2025/0192761 A1 Jun. 12, 2025

(30) Foreign Application Priority Data

Dec. 11, 2023 (TW) ................................ 112148052

(51) Int. Cl.
*H03K 3/42* (2006.01)
*H03K 17/56* (2006.01)

(52) U.S. Cl.
CPC ............... *H03K 3/42* (2013.01); *H03K 17/56* (2013.01)

(58) Field of Classification Search
CPC ................................ H03K 3/42; H03K 17/56
See application file for complete search history.

(56) References Cited

U.S. PATENT DOCUMENTS 4,227,098 A * 10/1980 Brown ................ H03K 17/785 257/E27.128
4,864,126 A * 9/1989 Walters ............ H03K 17/04206 327/515
RE35,836 E * 7/1998 Rodriguez ............ H03K 17/79 250/551

FOREIGN PATENT DOCUMENTS

CN 1292603 A 4/2001
CN 102576233 B 11/2014
CN 105122408 A 12/2015
CN 111211198 A 5/2020
CN 111756359 A 10/2020
CN 112908939 A 6/2021
CN 214588849 U 11/2021
CN 115483165 A 12/2022
(Continued)

OTHER PUBLICATIONS

An Office Action for JP Application No. 2024151199 dated Jun. 9, 2025 and its English translation is attached (8 pages).

*Primary Examiner* — Daniel C Puentes
(74) *Attorney, Agent, or Firm* — MUNCY, GEISSLER, OLDS & LOWE, P.C.

(57) ABSTRACT

A wide band-gap photo relay is provided. The wide band-gap photo relay includes first and second input terminals, first and second output terminals, a ground terminal, a light source, a photodiode array, and a depletion-mode wide band-gap semiconductor switch. The light source is configured to generate a light signal and has first and second ends coupled to the first and second input terminals, respectively. The photodiode array is disposed at a distance from the light source and has positive and negative terminals. The photodiode array senses the light signal and generates a voltage difference between the positive and negative terminals when the light signal is sensed. The positive terminal is coupled to the ground terminal. The depletion-mode wide band-gap semiconductor switch has a gate electrode coupled to the negative terminal, a drain electrode coupled to the first output terminal, and a source electrode coupled to the second output terminal.

16 Claims, 8 Drawing Sheets

4

(56) References Cited

FOREIGN PATENT DOCUMENTS

| | | | | | |
|---|---|---|---|---|---|
| CN | 218416166 | U | | 1/2023 | |
| CN | 116613209 | A | | 8/2023 | |
| CN | 112436832 | A | | 3/2024 | |
| EP | 0304951 | B1 | * | 6/1993 | ....... H03K 17/04123 |
| JP | 1996335866 | A | | 12/1996 | |
| JP | 1998308529 | A | | 11/1998 | |
| JP | H11214172 | A | * | 8/1999 | |
| JP | 200115796 | A | | 1/2001 | |
| JP | 2002353798 | A | | 12/2002 | |
| JP | 2005108908 | A | | 4/2005 | |
| JP | 2006186344 | A | * | 7/2006 | ............. H10F 55/00 |
| JP | 2007281934 | A | | 10/2007 | |
| JP | 2013157731 | A | | 8/2013 | |
| JP | 2013191705 | A | * | 9/2013 | |
| JP | 2014140141 | A | | 7/2014 | |
| TW | 201611327 | A | | 3/2016 | |
| TW | M619993 | U | | 11/2021 | |

* cited by examiner

WIDE BAND-GAP PHOTO RELAY

CROSS-REFERENCES TO RELATED APPLICATIONS

This application claims priority to Taiwan Patent Application No. 112148052 filed on Dec. 11, 2023, which is hereby incorporated by reference in its entirety.

BACKGROUND OF THE INVENTION

Field of the Invention

The present invention relates to a wide band-gap photo relay, particularly a wide band-gap photo relay using a depletion-mode wide band-gap semiconductor switch.

Description of the Related Art

In recent years, photo relays have been widely used in the fields of consumer electronics, automation and control systems, communication systems, and electric vehicles, etc.

Photo relays can control the switching of semiconductor switches at the high-voltage load end by using light signals generated by light-emitting diodes (LEDs) driven by low voltages. However, the off-state voltage and the switching speed of the semiconductor switches in the conventional photo relays are limited by material properties. This limitation makes photo relays difficult to achieve significant improvements.

Given this, how to improve the semiconductor switches in photo relays to enhance the off-state voltage and shorten the switching time, thereby improving their reliability and durability to meet various application requirements, is an urgent issue for the industry to solve.

SUMMARY OF THE INVENTION

An objective of the present invention is to provide a wide band-gap photo relay that increases the off-state voltage and switching speed by using a depletion-mode wide band-gap semiconductor switch. Therefore, compared with conventional photo relays, the wide band-gap photo relay of the present invention has the characteristics of high voltage resistance and high-speed switching in order to provide high reliability and high durability to meet various application requirements.

To achieve the above objective, the present invention discloses a wide band-gap photo relay, including a first input terminal, a second input terminal, a first output terminal, a second output terminal, a ground terminal, a light source, a photodiode array and a depletion-mode wide band-gap semiconductor switch. The light source is configured to generate a light signal and has a first end coupled to the first input terminal and a second end coupled to the second input terminal. The photodiode array is disposed at a distance from the light source and has a positive terminal and a negative terminal. The photodiode array is configured to sense the light signal and generate a voltage difference between the positive terminal and the negative terminal when the light signal is sensed. The positive terminal is coupled to the ground terminal. The depletion-mode wide band-gap semiconductor switch has a source electrode, a drain electrode and a gate electrode. The gate electrode is coupled to the negative terminal, the drain electrode is coupled to the first output terminal, and the source electrode is coupled to the second output terminal.

In an example, the light source i is a gallium arsenide (GaAs) light-emitting diode (LED).

In an example, the photodiode array includes a plurality of silicon photodiodes, and the silicon photodiodes are connected in series to form an array.

In an example, the wide band-gap photo relay further includes a control circuit coupled between the photodiode array and the depletion-mode wide band-gap semiconductor switch.

In an example, the depletion-mode wide band-gap semiconductor switch is one of a depletion-mode gallium nitride (GaN) high electron mobility transistor (HEMT) and a silicon carbide (SiC) junction field-effect transistor (JFET).

In an example, the light source and the photodiode array are arranged laterally to each other.

In an example, the light source and the photodiode array are arranged vertically to each other.

In an example, the wide band-gap photo relay further includes a diode, wherein an anode of the diode is coupled to the source electrode, and a cathode of the diode is coupled to the drain electrode.

In addition, the present invention further discloses a wide band-gap photo relay, including a first input terminal, a second input terminal, a first output terminal, a second output terminal, a ground terminal, a light source, a photodiode array and a depletion-mode wide band-gap semiconductor switch pair. The light source is configured to generate a light signal and has a first end coupled to the first input terminal and a second end coupled to the second input terminal. The photodiode array is disposed at a distance from the light source and has a positive terminal and a negative terminal. The photodiode array is configured to sense the light signal and generates a voltage difference between the positive terminal and the negative terminal when the light signal is sensed. The positive terminal is coupled to the ground terminal. The depletion-mode wide band-gap semiconductor switch pair includes a first depletion-mode wide band-gap semiconductor switch and a second depletion-mode wide band-gap semiconductor switch. The first depletion-mode wide band-gap semiconductor switch has a first source electrode, a first drain electrode and a first gate electrode, wherein the first gate electrode is coupled to the negative terminal, and the first drain electrode is coupled to the first output terminal. The second depletion-mode wide band-gap semiconductor switch has a second source electrode, a second drain electrode and a second gate electrode, wherein the second gate electrode is coupled to the negative terminal, the second source electrode is coupled to the first source electrode, and the second drain electrode is coupled to the second output terminal.

In an example, the light source is a gallium arsenide (GaAs) light-emitting diode (LED).

In an example, the photodiode array includes a plurality of silicon photodiodes, and the silicon photodiodes are connected in series to form an array.

In an example, the wide band-gap photo relay further includes a control circuit coupled between the photodiode array and the depletion-mode wide band-gap semiconductor switch pair.

In an example, each of the first depletion-mode and the second depletion-mode wide band-gap semiconductor switch is one of a depletion-mode gallium nitride (GaN) high electron mobility transistor (HEMT) and a silicon carbide (SiC) junction field-effect transistor (JFET).

In an example, the light source and the photodiode array are arranged laterally to each other.

In an example, the light source and the photodiode array are arranged vertically to each other.

In an example, the wide band-gap photo relay further includes a first diode and a second diode, wherein an anode of the first diode is coupled to the first source electrode, a cathode of the first diode is coupled to the first drain electrode, an anode of the second diode is coupled to the second source electrode, and a cathode of the second diode is coupled to the second drain electrode.

After referring to the drawings and the detailed description of embodiments described later, those of ordinary skill in the art can understand other objectives of the present invention, as well as the technical means and implementations of the present invention.

DETAILED DESCRIPTION OF THE PREFERRED EMBODIMENT

In the following description, the present invention will be explained with reference to various embodiments thereof. These embodiments of the present invention are not intended to limit the present invention to any specific environment, application or particular method for implementations described in these embodiments. Therefore, the description of these embodiments is for illustrative purposes only and is not intended to limit the present invention. It shall be appreciated that, in the following embodiments and the attached drawings, partial elements not directly related to the present invention are omitted from the illustration, and dimensional proportions among individual elements and the numbers of each element in the accompanying drawings are provided only for ease of understanding but are not intended to limit the actual scale.

Figure 1:
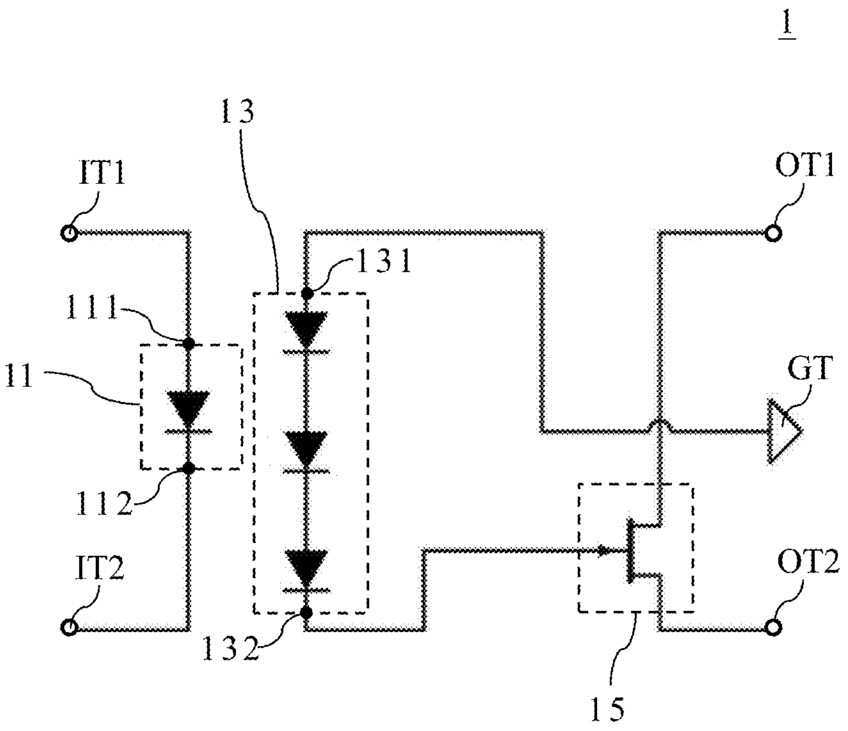
FIG. 1 is a circuit schematic view of a wide band-gap photo relay 1 according to an embodiment of the present invention.

FIG. 1 shows an embodiment of the present invention, which is a circuit schematic view of a wide band-gap photo relay 1. The wide band-gap photo relay 1 includes a first input terminal IT1, a second input terminal IT2, a first output terminal OT1, a second output terminal OT2, a ground terminal GT, a light source 11, a photodiode array 13 and a depletion-mode wide band-gap semiconductor switch 15.

The light source 11 is used to generate a light signal and has a first end 111 and a second end 112. The first end 111 is coupled to the first input terminal IT1, and the second end 112 is coupled to the second input terminal IT2. The light source 11 may be, but is not limited to, a gallium arsenide (GaAs) light emitting diode (LED) for generating infrared light with a wavelength between 840 nm and 920 nm. By inputting a voltage through the first input terminal IT1 and the second input terminal IT2, the light source 11 can generate the light signal.

The photodiode array 13 is disposed at a distance from the light source 11. The photodiode array 13 has a positive terminal 131 and a negative terminal 132. The photodiode array 13 is used to sense the light signal generated by the light source 11 and generate a voltage difference between the positive terminal 131 and the negative terminal 132 when sensing the light signal. The positive terminal 131 of the photodiode array 13 is coupled to the ground terminal GT. The photodiode array 13 may include a plurality of silicon photodiodes connected in series to form an array, but is not limited thereto. The voltage difference between the positive terminal 131 and the negative terminal 132 of the photodiode array 13 may range from 10V to 25V, depending on the number of silicon photodiodes connected in series.

The depletion-mode wide band-gap semiconductor switch 15 has a source electrode, a drain electrode and a gate electrode. The gate electrode is coupled to the negative terminal 132 of the photodiode array 13, the drain electrode is coupled to the first output terminal OT1, and the source electrode is coupled to the second output terminal OT2. When the photodiode array 13 senses a light signal and generates a voltage difference between the positive terminal 131 and the negative terminal 132, the voltage at the gate electrode of the depletion-mode wide band-gap semiconductor switch 15 is a negative voltage, which is smaller than the threshold voltage (also a negative voltage) of the wide band-gap semiconductor switch 15. Therefore, the depletion-mode wide band-gap semiconductor switch 15 is in an off state (i.e., it is not conducted). On the contrary, when the photodiode array 13 does not sense a light signal, the voltage at the gate electrode of the depletion-mode wide band-gap semiconductor switch 15 is 0, and therefore, the depletion-mode wide band-gap semiconductor switch 15 is in an on state (i.e., it is conducted).

The depletion-mode wide band-gap semiconductor switch 15 is a semiconductor switch with a high breakdown field strength and a high saturation electron drift speed. For example, the depletion-mode wide band-gap semiconductor switch 15 may be one of a depletion-mode gallium nitride (GaN) high electron mobility transistor (HEMT) and a silicon carbide (SiC) junction field-effect transistor (JFET). The depletion-mode gallium nitride HEMT may, for example, have a breakdown field strength of 3.3 MV/cm and a saturation electron drift speed of $2.5\times10^7$ cm/s. The SiC JFET may, for example, have a breakdown field strength of 3.5 MV/cm and a saturation electron drift speed of $2.0\times10^7$ cm/s.

Accordingly, the present invention uses a depletion-mode wide band-gap semiconductor switch 15 and couples its gate electrode to the negative terminal 132 of the photodiode array 13. Therefore, depending on whether the photodiode array 13 senses a light signal from the light source 11 and generates a voltage difference between the positive terminal 131 and the negative terminal 132, the present invention can perform fast switching operations on the depletion-mode wide band-gap semiconductor switch 15. Furthermore, compared with the response time of the enhancement-mode wide band-gap semiconductor switch, which can be about 5 ns to 50 ns, the response time of the depletion-mode wide band-gap semiconductor switch 15 can be as short as about 1 ns to 20 ns. Therefore, the semiconductor switch of the present invention is more suitable for applications that require fast switching.

In an implementation, the light source 11 and the photodiode array 13 can be disposed on a package substrate at a distance laterally from each other (i.e., arranged laterally (left and right) from each other), and by the optical path design (for example, a reflective coating layer containing silver, aluminum, polyethylene terephthalate (such as Mylar) or mica is disposed thereover) so that the photodiode array 13 can receive the reflected light of the light signal generated by the light source 11. However, in other implementations, the light source 11 and the photodiode array 13 may be disposed on different package substrates at a distance vertically from each other (i.e., arranged vertically (up and down) from each other), and the photodiode array 13 may receive the direct light of the light signal generated by the light source 11. Therefore, the arrangements between the light source 11 and the photodiode array 13 may vary with the optical path design, and these various arrangements fall within the scope of the present invention.

Figure 2A:
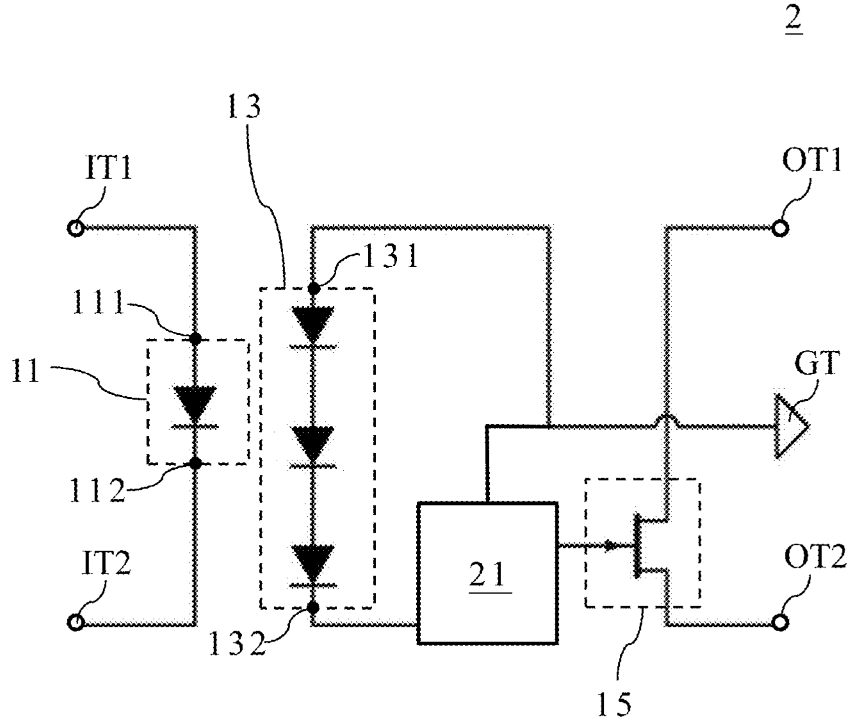
FIG. 2A is a circuit schematic view of a wide band-gap photo relay 2 according to an embodiment of the present invention.
Figure 2B:
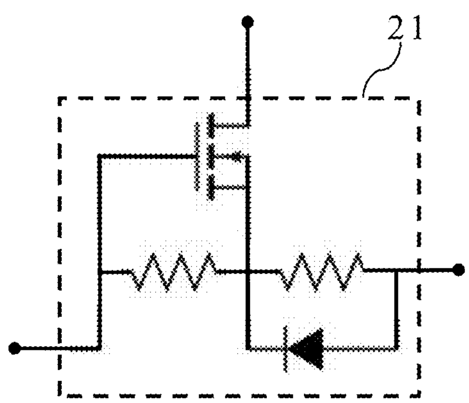
FIG. 2B is a schematic view of the control circuit 21 according to an embodiment of the present invention.

FIG. 2A is a circuit schematic view of the wide band-gap photo relay 2 according to an embodiment of the present invention. Different from the wide band-gap photo relay 1, the wide band-gap photo relay 2 may further include a control circuit 21. The control circuit 21 is coupled between the photodiode array 13 and the depletion-mode wide band-gap semiconductor switch 15 to further increase the switching speed. For example, the control circuit 21 may include a transistor, two resistors and a diode, as shown in FIG. 2B, but this circuit configuration is not intended to limit the present invention.

Figure 3:
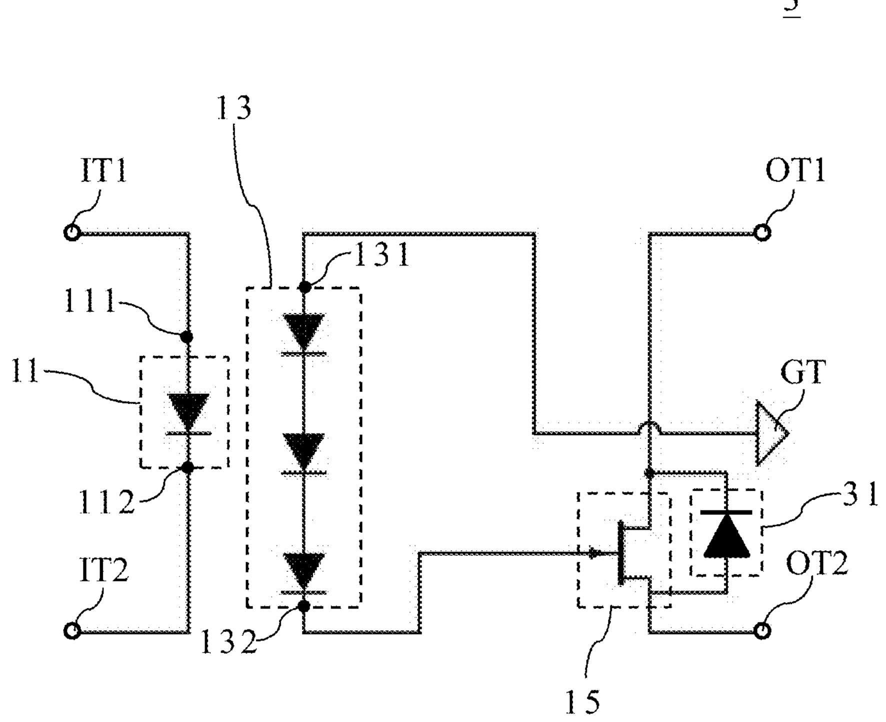
FIG. 3 is a circuit schematic view of a wide band-gap photo relay 3 according to an embodiment of the present invention.

FIG. 3 shows an embodiment of the present invention, which is a circuit schematic view of a wide band-gap photo relay 3. Different from the wide band-gap photo relay 1, the wide band-gap photo relay 3 further includes a diode 31. As shown in FIG. 3, the anode of the diode 31 is coupled to the source electrode of the depletion-mode wide band-gap semiconductor switch 15, and the cathode of the diode 31 is coupled to the drain electrode of the depletion-mode wide band-gap semiconductor switch 15, thereby providing, for example, further reverse bias protection and overvoltage protection for the depletion-mode wide band-gap semiconductor switch 15 and ensuring that the depletion-mode wide band-gap semiconductor switch 15 operates in the correct polarity.

In addition, in an embodiment, the wide band-gap photo relay of the present invention may have a control circuit 21 and a diode 31 at the same time, e.g., the combination of the wide band-gap photo relay 2 and the wide band-gap photo relay 3.

Figure 4:
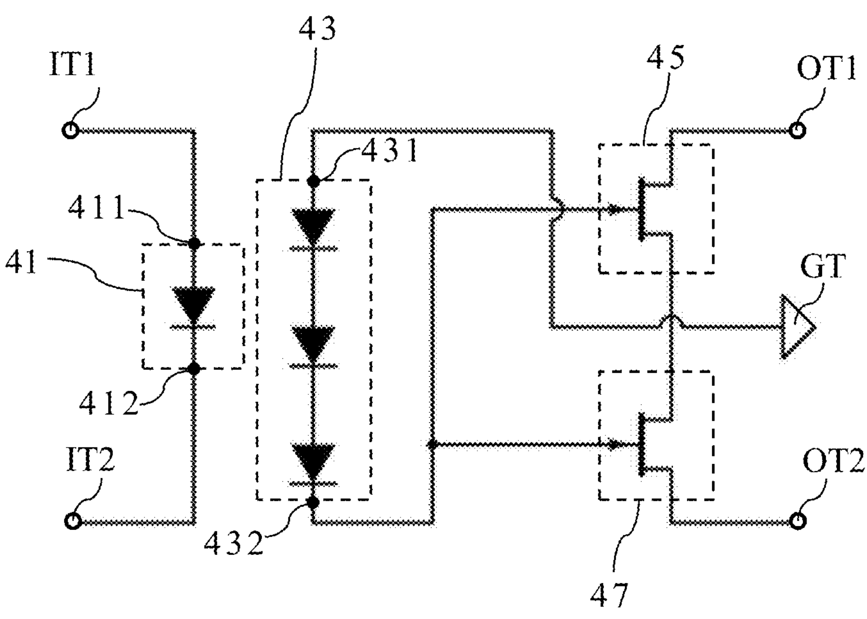
FIG. 4 is a circuit schematic view of a wide band-gap photo relay 4 according to an embodiment of the present invention.

FIG. 4 shows an embodiment of the present invention, which is a circuit schematic view of a wide band-gap photo relay 4. The wide band-gap photo relay 4 includes a first input terminal IT1, a second input terminal IT2, a first output terminal OT1, a second output terminal OT2, a ground terminal GT, a light source 41, a photodiode array 43 and a depletion-mode wide band-gap semiconductor switch pair (including a first depletion-mode wide band-gap semiconductor switch 45 and a second depletion-mode wide band-gap semiconductor switch 47).

Similarly, the light source 41 is used to generate a light signal and has a first end 411 and a second end 412. The first end 411 is coupled to the first input terminal IT1, and the second end 412 is coupled to the second input terminal IT2. The light source 41 may be a gallium arsenide (GaAs) LED, but is not limited thereto. By inputting a voltage through the first input terminal IT1 and the second input terminal IT2, the light source 41 can generate the light signal.

The photodiode array 43 is disposed at a distance from the light source 41. The photodiode array 43 has a positive terminal 431 and a negative terminal 432. The photodiode array 43 is used to sense the light signal generated by the light source 41, and generate a voltage difference between the positive terminal 431 and the negative terminal 432 when sensing the light signal. The positive terminal 431 of the photodiode array 43 is coupled to the ground terminal GT. The photodiode array 43 may include a plurality of silicon photodiodes connected in series to form an array, but is not limited thereto. Likewise, the voltage difference between the positive terminal 431 and the negative terminal 432 of the photodiode array 43 may range from 10V to 25V, depending on the number of silicon photodiodes connected in series.

The first depletion-mode wide band-gap semiconductor switch 45 has a first source electrode, a first drain electrode and a first gate electrode. The first gate electrode is coupled to the negative terminal 432 of the photodiode array 43. The first drain electrode is coupled to the first output terminal OT1. The second depletion-mode wide band-gap semiconductor switch 47 has a second source electrode, a second drain electrode and a second gate electrode. The second gate electrode is coupled to the negative terminal of the photodiode array 43. The second source electrode is coupled to the first source electrode. The second drain electrode is coupled to the second output terminal OT2. When the photodiode array 43 senses the light signal and generates a voltage difference between the positive terminal 431 and the negative terminal 432, the voltage at the first gate electrode of the first depletion-mode wide band-gap semiconductor switch 45 and the voltage at the second gate electrode of the second depletion-mode wide band-gap semiconductor switch 47 is a negative voltage less than the threshold voltage (also a negative voltage). Therefore, the first depletion-mode wide band-gap semiconductor switch 45 and the second depletion-mode wide band-gap semiconductor switch 47 are in an off state (i.e., they are not conducted). On the contrary, when the photodiode array 43 does not sense a light signal, the voltage at the first gate electrode of the first depletion-mode wide band-gap semiconductor switch 45 and the voltage at the second gate electrode of the second depletion-mode wide band-gap semiconductor switch 47 are 0, and therefore, the first depletion-mode wide band-gap semiconductor switch 45 and the second depletion-mode wide band-gap semiconductor switch 47 are in an on state (i.e., they are conducted).

Each of the first depletion-mode wide band-gap semiconductor switch 45 and the second depletion-mode wide band-gap semiconductor switch 47 is a semiconductor switch with high breakdown field strength and high saturation electron drift speed. For example, each of the first depletion-mode wide band-gap semiconductor switch 45 and the second depletion-mode wide band-gap semiconductor switch 47 may be one of a depletion-mode gallium nitride (GaN) high electron mobility transistor (HEMT) and a silicon carbide (SiC) junction field-effect transistor (JFET). The depletion-mode gallium nitride HEMT may, for example, have a breakdown field strength of 3.3 MV/cm and a saturation electron drift speed of $2.5\times10^7$ cm/s. The SiC JFET may, for example, have a breakdown field strength of 3.5 MV/cm and a saturation electron drift speed of $2.0\times10^7$ cm/s.

Accordingly, the present invention uses the first depletion-mode wide band-gap semiconductor switch 45 and the second depletion-mode wide band-gap semiconductor switch 47 and couples their gate electrodes to the negative terminal 432 of the photodiode array 43. Therefore, depending on whether the photodiode array 43 senses a light signal from the light source 41 and generates a voltage difference between the positive terminal 431 and the negative terminal 432, the present invention can perform fast switching operations on the first depletion-mode wide band-gap semiconductor switch 45 and the second depletion-mode wide band-gap semiconductor switch 47. As mentioned above, compared with the response time of the enhancement-mode wide band-gap semiconductor switch, which can be about 5 ns to 50 ns, the response time of each of the first depletion-mode wide band-gap semiconductor switch 45 and the second depletion-mode wide band-gap semiconductor switch 47 can be as short as about 1 ns to 20 ns. Therefore, the semiconductor switch of the present invention is more suitable for applications that require fast switching.

Similarly, in an implementation, the light source 41 and the photodiode array 43 can be disposed on a package substrate at a distance laterally from each other, and by the optical path design (e.g., a reflective coating layer containing silver, aluminum, polyethylene terephthalate (such as Mylar) or mica is disposed thereover) so that the photodiode array 43 can receive the reflected light of the light signal generated by the light source 41. However, in other implementations, the light source 41 and the photodiode array 43 may be disposed on different package substrates at a distance vertically from each other, and the photodiode array 43 may receive the direct light of the light signal generated by the light source 41. Therefore, the arrangements between the light source 41 and the photodiode array 43 may vary with the optical path design, and these various arrangements fall within the scope of the present invention.

Figure 5:
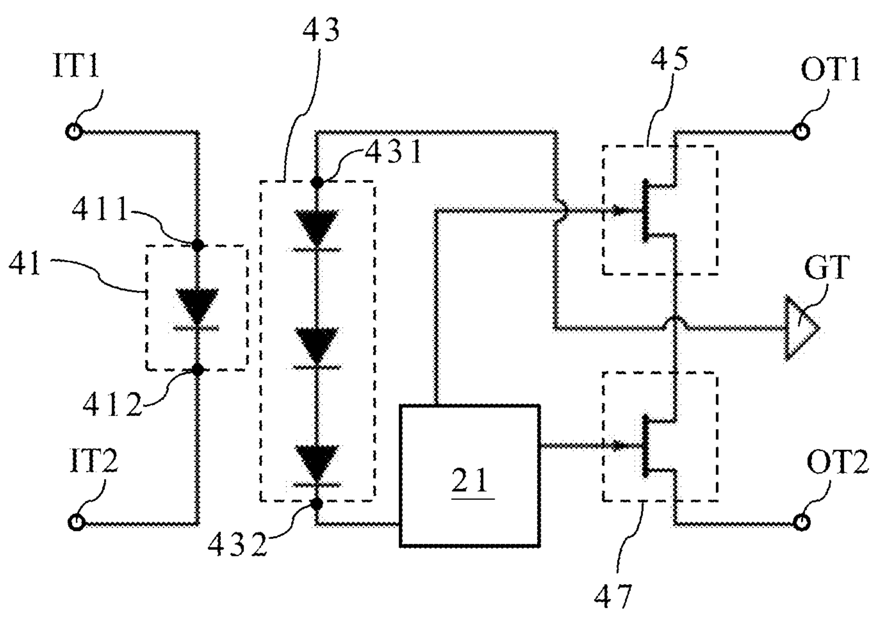
FIG. 5 is a circuit schematic view of the wide band-gap photo relay 5 according to an embodiment of the present invention.

FIG. 5 is a circuit schematic view of the wide band-gap photo relay 5 according to an embodiment of the present invention. Different from the wide band-gap photo relay4, the wide band-gap photo relay 5 further includes a control circuit 21 which is coupled between the photodiode array 13 and the depletion-mode wide band-gap semiconductor switch pair to further increase the switching speed. As mentioned above, the control circuit 21 may include a transistor, two resistors and a diode, as shown in FIG. 2B, but this circuit configuration is not intended to limit the present invention.

Figure 6:
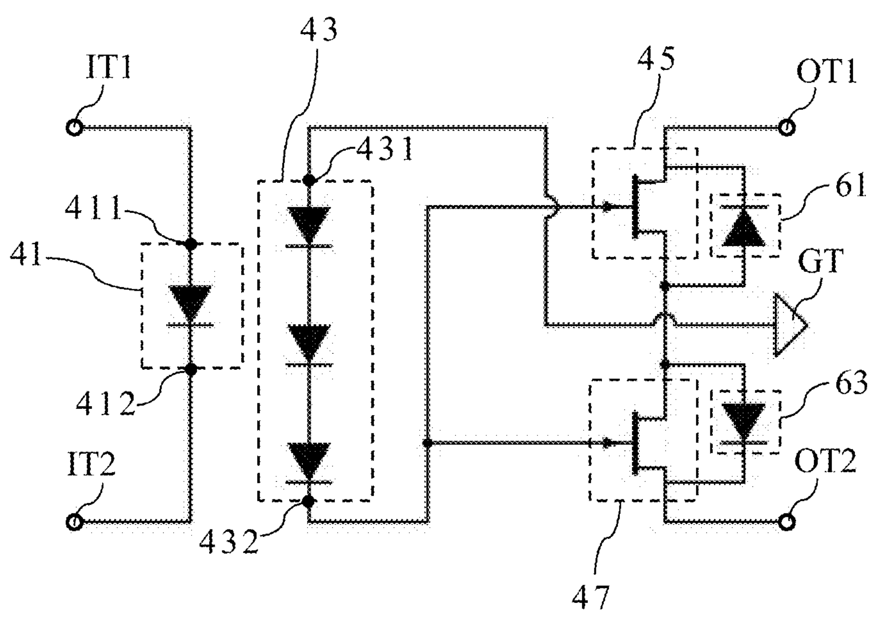
FIG. 6 is a circuit schematic view of a wide band-gap photo relay 6 according to an embodiment of the present invention.

FIG. 6 shows an embodiment of the present invention, which is a circuit schematic view of a wide band-gap photo relay 6. Different from the wide band-gap photo relay 4, the wide band-gap photo relay 6 further includes a first diode 61 and a second diode 63. As shown in FIG. 6, an anode and a cathode of the first diode 61 are coupled to the first source electrode and the first drain electrode of the first depletion-mode wide band-gap semiconductor switch 45, respectively, and an anode and a cathode of the second diode 63 are coupled to the second source electrode and the second drain electrode of the second depletion-mode wide band-gap semiconductor switch 47, respectively. In this way, the first diode 61 and the second diode 63 can provide further reverse bias protection and overvoltage protection for the first depletion-mode wide band-gap semiconductor switch 45 and the second wide band-gap semiconductor switch 47, respectively, and can ensure that the first depletion-mode wide band-gap semiconductor switch 45 and the second wide band-gap semiconductor switch 47 operate in the correct polarity, respectively.

Each of the aforementioned wide band-gap photo relays 1 to 6 may be packaged into a module for use in the fields of consumer electronics, automation and control systems, communication systems, and electric vehicles, etc., to provide switching functions by connecting it between other circuits.

Figure 7:
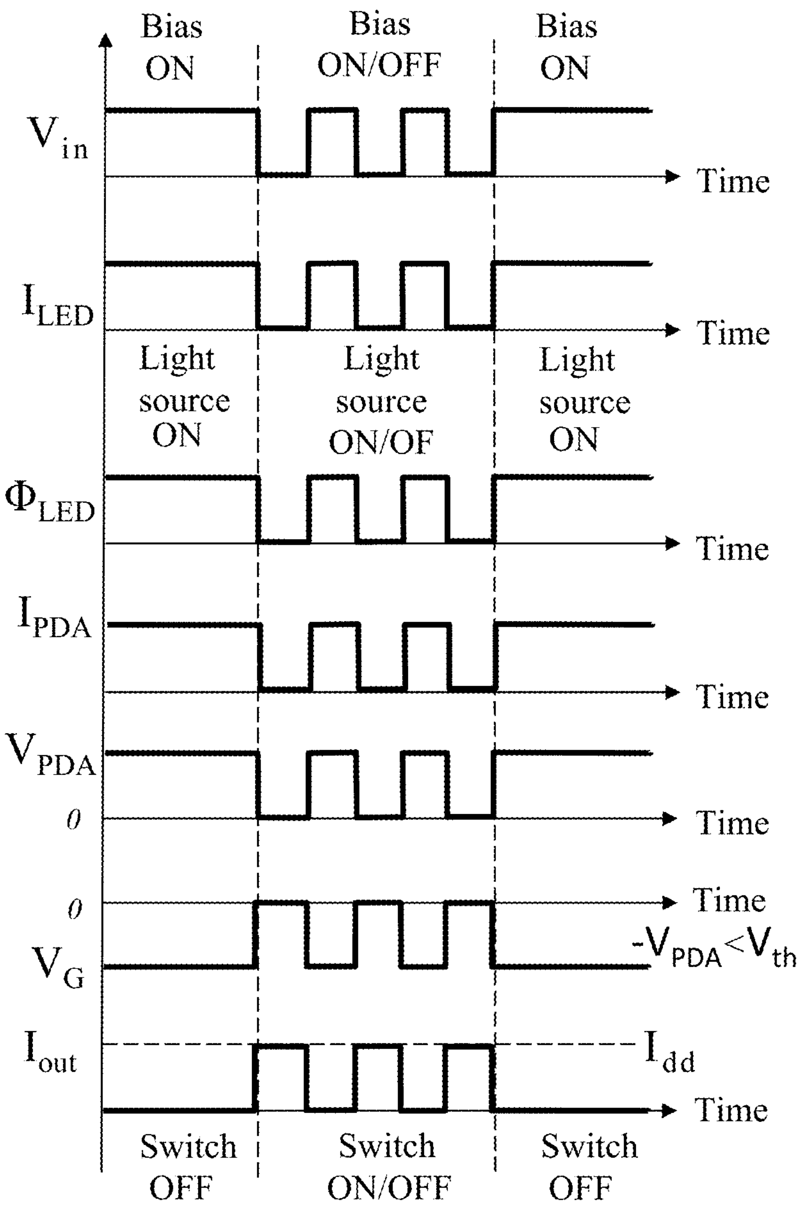
FIG. 7 is a timing schematic view of the states of each element during the operation of the wide band-gap photo relay according to an embodiment of the present invention.

FIG. 7 is a timing schematic view of the states of each component during the operation of the wide band-gap photo relay (e.g., the wide band-gap photo relays 1 to 6 of the above embodiments) according to an embodiment of the present invention. $V_{in}$ is the voltage input through the first input terminal IT1 and the second input terminal IT2, i.e., the driving voltage of the light source (e.g., the light source 11 and the light source 41), which is typically between 3V and 5V. $I_{LED}$ is the driving current flowing through the light source, which corresponds to $V_{in}$ and is typically between 0.5 mA and 10 mA. PLED is the luminous flux of the light signal generated by the light source, which is typically several milliwatts (mW).

$I_{PDA}$ is a sensing current generated by the photodiode array (e.g., the photodiode array 13 and the photodiode array 43) when a light signal is sensed, and it is typically between 10 uA and 100 uA. $V_{PDA}$ is the sensing voltage generated between the positive terminal and the negative terminal of the photodiode array when a light signal is sensed, and it is typically between 20V and 30V. Vi is the threshold voltage of the depletion-mode wide band-gap semiconductor switch, which is a negative voltage. $V_G$ is the gate voltage of the depletion-mode wide band-gap semiconductor switch (e.g., the depletion-mode wide band-gap semiconductor switch 15, the first depletion-mode wide band-gap semiconductor switch 45 and the second depletion-mode wide band-gap semiconductor switch 47). Since the present invention couples the positive terminal of the photodiode array to the ground terminal GT, $V_G$ will be equal to $-V_{PDA}$, which is typically between −5V and −25V and less than $V_{th}$. $I_{out}$ is the output current between the first output terminal OT1 and the second output terminal OT2. As shown in FIG. 7, $I_{out}$ switches between 0 and $I_{dd}$. $I_{dd}$ is the input current of the high-voltage load end, which is typically between 1 A and 50 A.

It can be seen from FIG. 7 that when the voltage is input from the first input terminal IT1 and the second input terminal IT2 (i.e., when the bias voltage of $V_{in}$ is turned on), the light source will be driven (i.e., the light source is turned on) to generate a light signal. At this time, $V_G$ is-$V_{PDA}$, and therefore, the depletion-mode wide band-gap semiconductor switch is turned off. Subsequently, when the first input terminal IT1 and the second input terminal IT2 do not input voltage (i.e., when the bias voltage of $V_{in}$ is turned off), the light source is not driven (i.e., the light source is turned off). At this time, $V_G$ is 0V, and therefore, the depletion-mode wide band-gap semiconductor switch is turned on. Accordingly, by turning on/off the bias voltage of $V_{in}$ to turn on/off the light source, the switch can be switched fast.

In summary, the wide band-gap photo relay of the present invention increases the off-state voltage and switching speed by using a depletion-mode wide band-gap semiconductor switch. Therefore, compared with conventional photo relays, the wide band-gap photo relay of the present invention has the characteristics of high voltage resistance and high-speed switching and provides high reliability and high durability to meet various application requirements.

The above embodiments are used only to illustrate the implementations of the present invention and to explain the technical features of the present invention, and are not intended to limit the scope of the present invention. Any modifications or equivalent arrangements that can be easily accomplished by those skilled in this art are considered to fall within the scope of the present invention, and the scope of the present invention should be limited by the claims of the patent application.

What is claimed is:

1. A wide band-gap photo relay, comprising:

a first input terminal;

a second input terminal;

a first output terminal;

a second output terminal;

a ground terminal;

a light source, being configured to generate a light signal and having a first end coupled to the first input terminal and a second end coupled to the second input terminal;

a photodiode array, being disposed at a distance from the light source and having a positive terminal and a negative terminal, the photodiode array being configured to sense the light signal and generate a voltage difference between the positive terminal and the negative terminal when the light signal is sensed, the positive terminal being coupled to the ground terminal; and a depletion-mode wide band-gap semiconductor switch, having a source electrode, a drain electrode and a gate electrode, the gate electrode being coupled to the negative terminal, the drain electrode being coupled to the first output terminal, and a source electrode being coupled to the second output terminal.

2. The wide band-gap photo relay of claim 1, wherein the light source is a gallium arsenide (GaAs) light-emitting diode (LED).

3. The wide band-gap photo relay of claim 1, wherein the photodiode array comprises a plurality of silicon photodiodes, and the silicon photodiodes are connected in series to form an array.

4. The wide band-gap photo relay of claim 1, further comprising a control circuit coupled between the photodiode array and the depletion-mode wide band-gap semiconductor switch.

5. The wide band-gap photo relay of claim 1, wherein the depletion-mode wide band-gap semiconductor switch is one of a depletion-mode gallium nitride (GaN) high electron mobility transistor (HEMT) and a silicon carbide (SiC) junction field-effect transistor (JFET).

6. The wide band-gap photo relay of claim 1, wherein the light source and the photodiode array are arranged laterally to each other.

7. The wide band-gap photo relay of claim 1, wherein the light source and the photodiode array are arranged vertically to each other.

8. The wide band-gap photo relay of claim 1, further comprising a diode, wherein an anode of the diode is coupled to the source electrode, and a cathode of the diode is coupled to the drain electrode.

9. A wide band-gap photo relay, comprising:

a first input terminal;

a second input terminal;

a first output terminal;

a second output terminal;

a ground terminal;

a light source, being configured to generate a light signal and having a first end coupled to the first input terminal and a second end coupled to the second input terminal;

a photodiode array, being disposed at a distance from the light source and having a positive terminal and a negative terminal, the photodiode array being configured to sense the light signal and generate a voltage difference between the positive terminal and the negative terminal when the light signal is sensed, the positive terminal being coupled to the ground terminal; and a depletion-mode wide band-gap semiconductor switch pair, comprising:

a first depletion-mode wide band-gap semiconductor switch, having a first source electrode, a first drain electrode and a first gate electrode, the first gate electrode being coupled to the negative terminal, the first drain electrode being coupled to the first output terminal; and a second depletion-mode wide band-gap semiconductor switch, having a second source electrode, a second drain electrode and a second gate electrode, the second gate electrode being coupled to the negative terminal, the second source electrode being coupled to the first source electrode, the second drain electrode being coupled to the second output terminal.

10. The wide band-gap photo relay of claim 9, wherein the light source is a gallium arsenide (GaAs) light-emitting diode (LED).

11. The wide band-gap photo relay of claim 9, wherein the photodiode array comprises a plurality of silicon photodiodes, and the silicon photodiodes are connected in series to form an array.

12. The wide band-gap photo relay of claim 9, further comprising a control circuit coupled between the photodiode array and the depletion-mode wide band-gap semiconductor switch pair.

13. The wide band-gap photo relay of claim 9, wherein each of the first depletion-mode wide band-gap semiconductor switch and the second depletion-mode wide band-gap semiconductor switch is one of a depletion-mode gallium nitride (GaN) high electron mobility transistor (HEMT) and a silicon carbide (SiC) junction field-effect transistor (JFET).

14. The wide band-gap photo relay of claim 9, wherein the light source and the photodiode array are arranged laterally to each other.

15. The wide band-gap photo relay of claim 9, wherein the light source and the photodiode array are arranged vertically to each other.

16. The wide band-gap photo relay of claim 9, further comprising a first diode and a second diode, wherein an anode of the first diode is coupled to the first source electrode, a cathode of the first diode is coupled to the first drain electrode, an anode of the second diode is coupled to the second source electrode, and a cathode of the second diode is coupled to the second drain electrode.

* * * * *